(12) United States Patent
Song et al.

(10) Patent No.: US 9,401,390 B2
(45) Date of Patent: Jul. 26, 2016

(54) ARRAY SUBSTRATE, METHOD FOR FABRICATING THE SAME, AND OLED DISPLAY DEVICE

(71) Applicant: BOE TECHNOLOGY GROUP CO., LTD., Beijing (CN)

(72) Inventors: Youngsuk Song, Beijing (CN); Seongyeol Yoo, Beijing (CN); Seungjin Choi, Beijing (CN); Heecheol Kim, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/105,145

(22) Filed: Dec. 12, 2013

(65) Prior Publication Data

US 2014/0159022 A1 Jun. 12, 2014

(30) Foreign Application Priority Data

Dec. 12, 2012 (CN) .......................... 2012 1 0536737

(51) Int. Cl.
*H01L 29/08* (2006.01)
*H01L 27/32* (2006.01)
(Continued)

(52) U.S. Cl.
CPC .......... *H01L 27/3248* (2013.01); *H01L 27/322* (2013.01); *H01L 27/3258* (2013.01);
(Continued)

(58) Field of Classification Search
CPC .................. H01L 2251/5315; H01L 27/3206; H01L 27/322; H01L 27/3248; H01L 27/3272; H01L 51/5265; H01L 51/56

USPC .............. 257/40, 59, 72, 88–89, 98, E51.022; 313/503–504, 512
See application file for complete search history.

(56) References Cited

U.S. PATENT DOCUMENTS

| 7,067,973 B2 | 6/2006 | Murakami et al. |
| 2005/0062407 A1* | 3/2005 | Suh et al. ...................... 313/504 |

(Continued)

FOREIGN PATENT DOCUMENTS

| CN | 1444426 A | 9/2003 |
| CN | 1868240 A | 11/2006 |

(Continued)

OTHER PUBLICATIONS

First Office Action for corresponding Chinese Patent Application No. 201210536737.6, 26 pages (including English translation), (Sep. 26, 2014).

(Continued)

*Primary Examiner* — H Tsai
(74) *Attorney, Agent, or Firm* — Blakely, Sokoloff, Taylor & Zafman LLP

(57) ABSTRACT

This invention provides an array substrate, a method for fabricating the same, and an OLED display device, which can solve the technical problem that the existing OLED display device has low luminous efficiency. Each pixel unit of the array substrate comprises: a TFT drive layer; an OLED further away from the substrate than the TFT drive layer and driven by it, the OLED sequentially comprises a first electrode, a light emitting layer, and a transparent second electrode, wherein the first electrode is a reflection layer, or the first electrode is transparent and has a reflection layer disposed thereunder; a transflective layer further away from the substrate than the OLED and forming a microcavity structure with the reflection layer; and a color filter film disposed between the OLED and the transflective layer and located in the microcavity structure. The present invention is particularly suitable for a WOLED display device.

15 Claims, 4 Drawing Sheets

(51) Int. Cl.
*H01L 51/52* (2006.01)
*H01L 51/56* (2006.01)

(52) U.S. Cl.
CPC ........ *H01L51/5209* (2013.01); *H01L 51/5265* (2013.01); *H01L 51/5271* (2013.01); *H01L 51/56* (2013.01); *H01L 27/3206* (2013.01); *H01L 27/3272* (2013.01); *H01L 2251/5315* (2013.01)

(56) References Cited

U.S. PATENT DOCUMENTS

| | | | |
|---|---|---|---|
| 2006/0138945 A1 | 6/2006 | Wolk et al. | |
| 2007/0120453 A1* | 5/2007 | Hwang et al. | 313/112 |
| 2009/0066236 A1* | 3/2009 | Sung et al. | 313/504 |
| 2012/0205676 A1* | 8/2012 | Seo | H01L 51/504 257/88 |

FOREIGN PATENT DOCUMENTS

| | | |
|---|---|---|
| CN | 101091268 A | 12/2007 |
| CN | 101415281 A | 4/2009 |
| CN | 203218266 U | 9/2013 |
| WO | WO 2005/039248 A1 | 4/2005 |

OTHER PUBLICATIONS

European Patent Office Communication enclosing Extended European Search Report for corresponding European Patent Application No. 13196277.1, 9 pages, (Mar. 12, 2014).

Yue-Feng Liu, et al., "Omnidirectional Emission from Top-Emitting Organic Light-Emitting Devices with Microstructured Cavity", Optics Letters, vol. 37, No. 2, pp. 124-126, (Jan. 15, 2012).

Second Office Action for corresponding Chinese Patent Application No. 201210536737.6, 29 pages (including English translation), (Feb. 10, 2015).

* cited by examiner

ARRAY SUBSTRATE, METHOD FOR FABRICATING THE SAME, AND OLED DISPLAY DEVICE

FIELD OF THE INVENTION

The present invention relates to the field of OLED display technology, more particularly, to an array substrate, a method for fabricating the same and an OLED display device.

BACKGROUND OF THE INVENTION

An Organic Light Emitting Diode (OLED) is an organic thin film electroluminescent (EL) device, which has advantages of simple fabrication process, low cost, high luminous efficiency and easy formation of flexible structure. Therefore, display technology employing an OLED has become important display technology.

An OLED display device comprises a plurality of pixel units, each of which has an OLED disposed therein. The luminous intensity of each OLED is controlled by controlling current flowing through the OLED, thereby realizing image display. Herein, each visible pixel on a display is made of a plurality of adjacent pixel units emitting light of different colors, and light emitted from the respective pixel units is mixed to form light emitted from the visible pixel. Colors (that is, colors of the corresponding color filter films) of the pixel units constituting the visible pixel may be selected in different modes, such as the RGB (red, green, blue) mode (that is, a red pixel unit, a green pixel unit, and a blue pixel unit form a visible pixel unit), the RGBW (red, green, blue, white) mode and the RGBY (red, green, blue, yellow) and the like.

As technologies of white OLEDs (WOLEDs) are well developed and WOLEDs have high luminous efficiency, the OLEDs are widely used in OLED display devices.

As illustrated in FIG. 1, a visible pixel unit of a WOLED display device may comprise three pixel units 9R, 9G and 9B of red, green, and blue (Of course, other modes are also applicable) disposed on a substrate 7, each pixel unit 9R, 9G or 9B has a Thin Film Transistor (TFT) drive layer 1 disposed therein, and an anode (a first electrode 21), a light emitting layer 23, a cathode (a second electrode 22), an encapsulation layer 8, and a color filter film 3R, 3G, or 3B (also referred to as a color filter plate) with a corresponding color are sequentially disposed on the TFT drive layer 1. The anode, the light emitting layer 23 and the cathode form an OLED 2. The TFT drive layer 1 may drive the anodes of the respective pixel units 9R, 9G and 9B independently, such that the respective OLEDs 2 emit light with different brightness, which becomes light of different colors after passing through corresponding color filter films 3R, 3G and 3B and is then mixed to form light emitted from the visible pixel.

To improve luminous efficiency, a microcavity structure may be formed in an OLED display device. The microcavity structure is a structure with a thickness in micron dimension formed between a reflection layer and a transflective layer and light is continuously reflected between the two layers. Due to the resonance effect, light with specific wavelength in the light eventually emitted from the transflective layer is enhanced, and the wavelength of the enhanced light depends on the thickness of the microcavity structure.

In a WOLED display device, different pixel units are used to emit light of different colors. Therefore, microcavity structures at different pixel units should enhance light with different wavelengths (light having the same color as the color filter film), that is, the microcavity structures at different pixel units are of different thicknesses. To achieve this, as illustrated in FIG. 2, in the WOLED display device, the cathode is set as a transflective layer 6, the anode is set as a transparent layer, and a reflection layer 4 is further disposed blow the anode. As such, the thicknesses of the microcavity structures of the corresponding pixel units 9R, 9G and 9B may be controlled by adjusting the thicknesses of respective anodes.

However, the inventors find that at least the following problem exists in the prior art: the respective anodes of the array substrate are disposed in the same layer and may be originally formed in a single patterning process at the same time. However, in a WOLED display device having microcavity structures, the anodes of respective pixel units are of different thicknesses, and therefore they are separately formed in a plurality of patterning processes, or a dual-tone mask needs to be used in the patterning process, while these methods lead to complicated fabrication process and high cost.

SUMMARY OF THE INVENTION

Technical problems to be solved by the present invention include: providing an array substrate with simple fabrication process, and low cost, in view of the problem that array substrates with microcavity structures have complicated fabrication process and high cost in the prior art.

A technical solution used to solve the technical problems of the present invention is an array substrate, comprising a plurality of pixel units disposed on a substrate, each pixel unit comprises: a TFT drive layer: an OLED further away from the substrate than the TFT drive layer and driven by the TFT drive layer, the OLED sequentially comprising a first electrode, a light emitting layer, and a transparent second electrode in a direction away from the substrate; wherein the first electrode is a reflection layer, or the first electrode is transparent and has a reflection layer disposed thereunder; a transflective layer further away from the substrate than the OLED and forming a microcavity structure together with the reflection layer; and a color filter film disposed between the OLED and the transflective layer and located in the microcavity structure.

Herein, the TFT drive layer is a TFT array structure for driving the OLED and comprises a multi-layer structure including a TFT, a scan line, a data line, a supply voltage line, an insulating layer, a passivation layer etc. An OLED refers to as a structure capable of emitting light which comprises a first electrode, a second electrode and a light emitting layer sandwiched therebetween. In some regions on the substrate (such as those between respective pixel units), there may be only the second electrode and the light emitting layer but without the first electrode (therefore, the first electrodes in respective pixel units are separated from each other). Alternatively, an insulating pixel defining layer may be disposed between the first or the second electrode and the light emitting layer, such regions cannot emit light and thus not OLED is formed in these regions. Therefore, the reflection layer and the color filter film are only disposed at regions opposite to the OLEDs and not disposed at regions where the OLEDs are not formed. The light emitting layer refers to as a structure that may emit light under the action of current and may be a single-layer or multi-layer structure. The light emitting layer comprises at least one organic electroluminescent material layer (EML), but it may also comprise an Electron transport layer (ETL) and an Electron injection layer (EIL) between the organic EML and the cathode layer, a Hole injection layer (HIL) and a Hole transport layer (HTL) between the organic EML and the anode layer, and other structures.

In the array substrate of the present invention, the color filter film is disposed in the microcavity structure, and the thickness of the microcavity structure can thus be adjusted by controlling the thickness of the color filter film. As the color filter films for pixel units of different colors are supposed to be formed in different steps, their thickness can be easily controlled respectively. Therefore, the method for fabricating an array substrate of the present invention is simple and of low cost in comparison with a conventional method for fabricating an array substrate with microcavity structures of different thickness formed in multiple patterning processes. Moreover, as the reflection layer and the OLED are disposed above the TFT drive layer, on one hand a location where the TFT is located may also be used to emit light, which results in high aperture ratio and high luminous efficiency, and on the other hand, the reflection layer may prevent the light from being incident on the TFT, thereby reducing leakage current of the TFT, leading to more precise display.

Preferably, the light emitting layer is a layer used for emitting white light.

Further preferably, the layer used for emitting white light comprises overlapping organic electroluminescent material layers emitting red light, green light and blue light, respectively; or is an organic electroluminescent material layer formed by mixing organic electroluminescent materials emitting red light, green light and blue light, respectively.

That is to say, the light emitting layer may emit white light in various ways. For example, the organic EL material layers respectively emitting red light, green light and blue light (of course, combination of other colors may also be used) may be overlapped, such that light emitted by the organic electroluminescent material layers is mixed to form white light. Alternatively, organic electroluminescent materials respectively emitting red light, green light and blue light may be mixed to form an organic electroluminescent material layer to emit white light.

Preferably, a reflective surface of the reflection layer has a concave-convex or corrugated structure disposed thereon for causing diffuse reflection of light.

The 'concave-convex or corrugated structure' refers to as a structure whose reflective surface has different heights at different locations in the thickness direction of the reflection layer so as to cause diffuse reflection of light incident on the reflective surface. Specifically, it may be convex dots or concave dots distributed on the reflective surface as a grid, or a strip-shaped corrugated structure, as long as the reflective surface has ups and downs.

With the concave-convex or corrugated structure on the reflection layer, diffuse reflection of light occurs in the microcavity structure, increasing total amount of emitted light and improving luminous efficiency, and research shows that luminous efficiency may be improved by 50% with such a structure.

Further preferably, the array substrate further comprises a resin layer disposed between the reflection layer and the TFT drive layer, and a surface of the resin layer contacting the reflection layer has a concave-convex or corrugated structure disposed thereon.

As the reflection layer is generally made of metal material and has no fluidity, its surface morphology may vary with morphology of its underlying structure. Therefore, by disposing the concave-convex or corrugated structure on the resin layer, a corresponding concave-convex or corrugated structure is naturally formed on the reflection layer. Moreover, due to the resin layer, parasitic capacitance between the first electrode (anode) and various electrodes and wires in the TFT drive layer under the first electrode is decreased, thus further increasing luminous efficiency.

Further preferably, a via is disposed in the resin layer, the first electrode is electrically connected to the TFT drive layer through the via, and an insulating pixel defining layer between the first electrode and the light emitting layer is disposed at the via.

Further preferably, a thickness of the resin layer is in the range of 1000 to 30000 Å.

Preferably, the TFT drive layer comprises a scan line, a data line, a supply voltage line, and a plurality sets of TFTs, each set of TFTs are used to drive the OLED in a pixel unit; wherein each set of TFTs comprise a switch TFT and a drive TFT, as for the switch TFT, a gate electrode thereof is connected to the scan line, a source electrode thereof is connected to the data line, and a drain electrode is connected to a gate electrode of the drive TFT, and as for the drive TFT, a source electrode thereof is connected to the supply voltage line, and a drain electrode thereof is connected to the first electrode of the OLED.

Preferably, the reflection layer is made of any metal from silver, aluminum, molybdenum, copper, titanium and chrome or an alloy of any two or more metals therefrom, and has a reflectivity of 80% to 100% and a thickness of 100 to 10000 Å.

Preferably, the transflective layer is made of any metal from silver, aluminum, molybdenum, copper, titanium and chrome or an alloy of any two or more metals therefrom, and has a transmissivity of 5% to 95% and a thickness of 10 to 200 Å.

Preferably, a via is disposed in the color filter film, the second electrode is electrically connected to the transflective layer through the via, the transflective layer is made of conductive material, and an insulating pixel defining layer between the first electrode and the light emitting layer is disposed at the via.

That is to say, the transflective layer is conductive and connected to the second electrode, thereby assisting the second electrode in conducting electricity, so as to decrease its resistance and prevent TFT drive from being non-uniform, so that luminous efficiency and display effect can be increased.

Preferably, a thickness of the color filter film is in the range of 5000~40000 Å.

Preferably, the color filter film comprises a red filter film, a green filter film and a blue filter film; or a red filter film, a green filter film, a blue filter film and a white filter film; or a red filter film, a green filter film, a blue filter film and a yellow filter film.

That is to say, the color filter films in respective pixel units forming one visible pixel may have the above different color modes. Of course, other color modes can also be employed.

Preferably, the transparent second electrode is made of any one of indium tin oxide, indium zinc oxide, poly (3,4-ethylenedioxy-thiophene)-poly (styrene sulfonic acid), and carbon nanotube.

Preferably, the first electrode is a cathode of the OLED, the second electrode is an anode of the OLED; or the first electrode is an anode of the OLED, the second electrode is a cathode of the OLED.

Technical problems to be solved by the present invention include: providing a method for fabricating an array substrate with simple fabrication process, and low cost, in view of the problem that array substrates with microcavity structures are of complicated fabrication process and high cost in the prior art.

A technical solution used to solve the technical problems of the present invention is to provide a method for fabricating an array substrate, which comprises: forming a pattern comprising a TFT drive layer on a substrate; forming a pattern comprising an OLED on the subject subjected to the previous step, wherein a second electrode of the OLED away from the substrate is transparent, and a first electrode of the OLED close to the substrate is a reflection layer, or a first electrode of the OLED close to the substrate is transparent and a reflection layer is disposed thereunder; forming a pattern comprising a color filter film on the substrate subjected to the previous step; and forming a pattern comprising a transflective layer on the substrate subjected to the previous step.

Herein, a layer or a structure may be formed in various ways. For example, a whole film layer may be formed by means of coating, printing, deposition (sputtering, evaporation, chemical Vapor Deposition or the like); or, a desired pattern may also be directly formed through printing, controlled deposition and so on; or a desired pattern may also be formed through a patterning process, wherein a patterning process generally comprises forming a whole film layer, photoresist application, exposing, developing, etching, photoresist removal and other steps.

In an array substrate fabricated according to the method of the present invention, the color filter film is disposed in the microcavity structure; therefore thickness of the microcavity structure may be adjusted by controlling thickness of each color filter film when forming color filter films of different colors, without adding any new step. Therefore, the fabrication process is simple and of low cost.

Preferably, between the step of forming a pattern comprising a TFT drive layer and the step of forming a pattern comprising an OLED, the method further comprises a step: forming a pattern of a resin layer on the substrate subjected to the previous step, wherein a concave-convex or corrugated structure is formed on the resin layer so that an upper surface of the reflection layer has a concave-convex or corrugated structure disposed thereon for causing diffuse reflection of light.

Through forming the concave-convex or corrugated structure, diffuse reflection of light occurs in the microcavity structure to further increase luminous efficiency of the array substrate.

Further preferably, forming a concave-convex or corrugated structure on the resin layer comprises forming the concave-convex or corrugated structure on the resin layer through a printing process or a patterning process using a dual-tone mask.

Herein, a patterning process using a dual-tone mask generally refers to a process in which a dual-tone mask (comprising a half-tone mask and a gray-tone mask) is used to control exposure amount of the photoresist at different locations, such that a part of the photoresist is exposed partially, and therefore the underlying layer is partially etched in the following etching step, thereby generating the concave-convex or corrugated structure.

Further preferably, the pattern of the resin layer comprises a via connected to the TFT drive layer; and the step of forming the pattern of the OLED on the substrate comprises steps: forming a pattern of the first electrode for reflecting light through a patterning process, or through a patterning process, first forming a pattern of the reflection layer and then forming a pattern of the transparent first electrode; wherein the first electrode being electrically connected to the TFT drive layer through the via; forming a pattern of an insulating pixel defining layer, which is at least formed above the via through a patterning process; forming a light emitting layer on the substrate subjected to the previous step; and forming the transparent second electrode on the substrate subjected to the previous step.

Preferably, a curing temperature of the color filter film is less than or equal to 130° C.

Since the color filter film is formed after the light emitting layer is formed in the present invention, the curing temperature of the color filter film may not be too high to prevent the light emitting layer from being destroyed.

Technical problems to be solved by the present invention include: providing an OLED display device with simple fabrication process and low cost, in view of the problem that array substrates with microcavity structures are of complicated fabrication process and high cost in the prior art.

A technical solution used to solve the technical problems of the present invention is to provide an OLED display device, which includes the above array substrate.

The OLED display device of the present invention comprises the above array substrate, and therefore is of simple fabrication process, and low cost.

The present invention is especially suitable for a WOLED display device.

DESCRIPTION OF REFERENCE NUMERALS

1. TFT drive layer; 10. drive TFT; 11. switch TFT; 111. gate electrode of the switch TFT; 112. source electrode of the switch TFT; 113. drain electrode of the switch TFT; 114. active region of the switch TFT; 121. gate electrode of the drive TFT; 122. source electrode of the drive TFT; 123. drain electrode of the drive TFT; 124. active region of the drive TFT; 12. gate insulating layers 13. spacer insulating layer; 14, passivation layer; 2. OLED; 21. first electrode; 22. second electrode; 23. light emitting layer; 3. color filter film; 3E. red filter film; 3G. green filter film; 3B. blue filter film; 4. reflection layer; 5 resin layer; 6. transflective layer; 7. substrate; 8. encapsulation layer; 9R. red pixel unit; 9G. green pixel unit;

9B. blue pixel unit; 91. pixel defining layer; DATA, data line; SCAN. scan line; Vdd. supply voltage line; Cs. storage capacitor.

Detailed Description of Embodiments

In the following, the present invention will be described in details in conjunction with the drawings and implementations, such that the person skilled in the art can better understand the technical solutions of the present invention.

Embodiment 1

Figure 1:
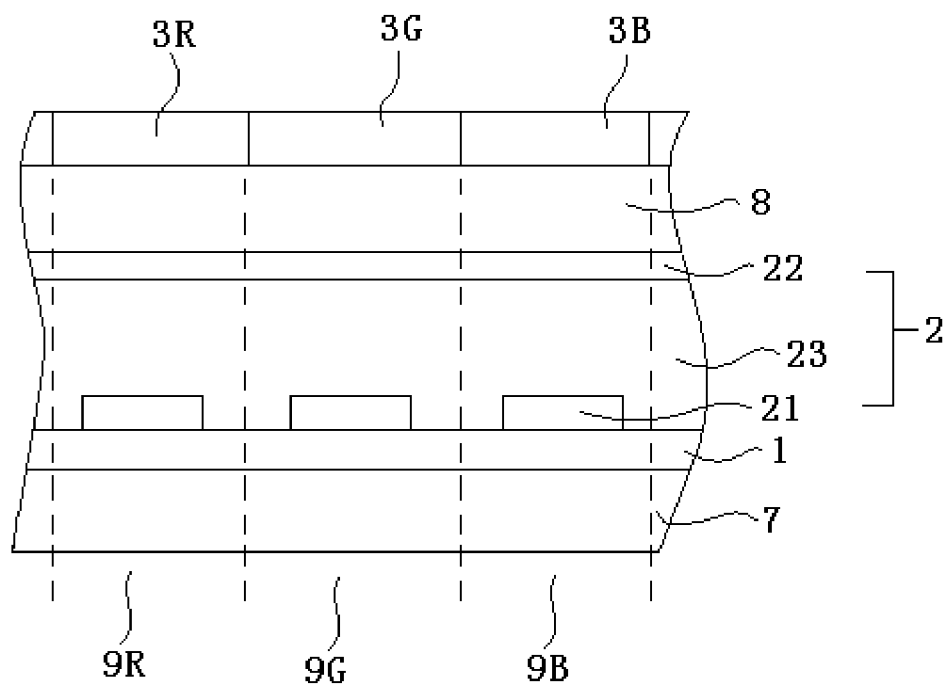
FIG. 1 is a schematic diagram illustrating a cross-sectional structure of a part of an existing array substrate.
Figure 2:
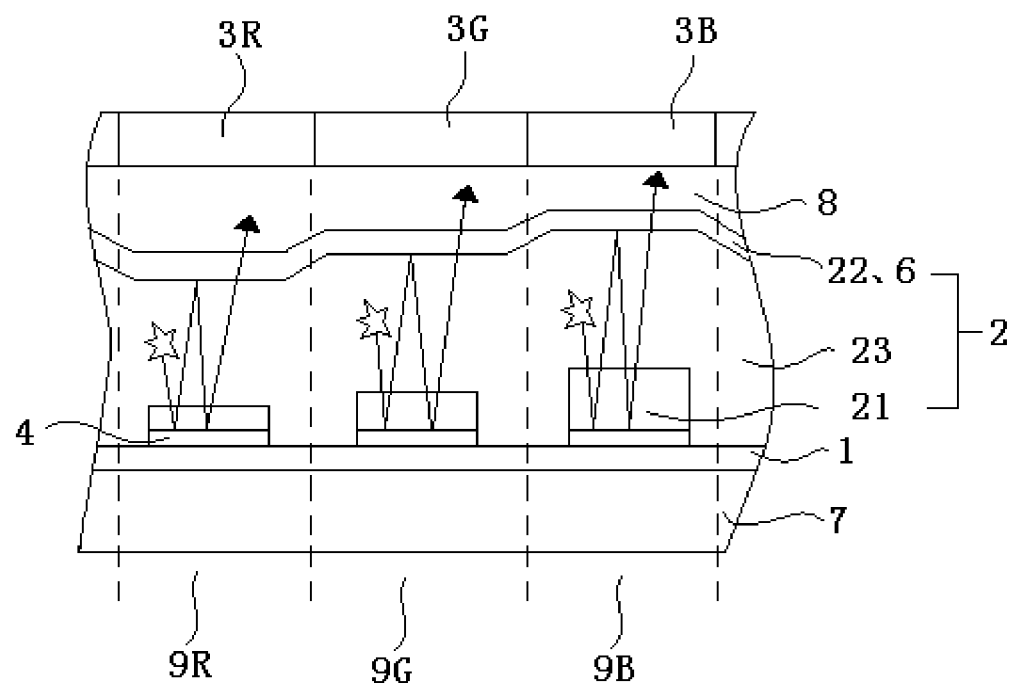
FIG. 2 is a schematic diagram illustrating a cross-sectional structure of a part of an existing array substrate having a microcavity structure.
Figure 3:
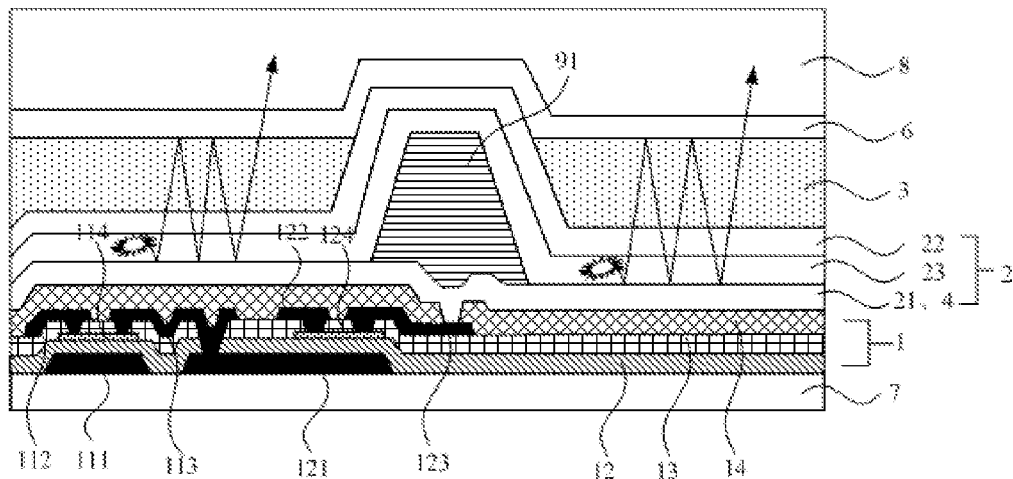
FIG. 3 is a schematic diagram illustrating a cross-sectional structure of a part of an array substrate of Embodiment 1 of the present invention.

As shown in FIG. 3, the present embodiment provides an array substrate, which comprises a plurality of pixel units disposed on a substrate 7; and each pixel unit comprises:

a TFT drive layer 1;

an OLED 2 further away from the substrate 7 than the TFT drive layer 1 and driven by it, the OLED 2 sequentially comprising a first electrode 21, a light emitting layer 23, and a transparent second electrode 22 in a direction away from the substrate 7, wherein the first electrode 21 is a reflection layer 4, or the first electrode 21 is transparent and has a reflection layer 4 disposed thereunder;

a transflective layer 6 further away from the substrate 7 than the OLED 2 and forming a microcavity structure with the reflection layer 4; and a color filter film 3 disposed between the OLED 2 and the transflective layer 6 and located in the microcavity structure.

In the array substrate of the present embodiment, the color filter film 3 is disposed in the microcavity structure, and the thickness of the microcavity structure can thus be adjusted by controlling the thickness of the color filter film 3. As the color filter films for pixel units of different colors are supposed to be formed in different steps, their thickness can be easily controlled respectively. Therefore, the method for fabricating an array substrate of the present invention is simple and of low cost. Moreover, as the reflection layer 4 and the OLED 2 are disposed above the TFT drive layer 1, on one hand a location where the TFT is located may also be used to emit light, which results in high aperture ratio and high luminous efficiency, and on the other hand, the reflection layer 4 may prevent the light from being incident on the TFT, thereby reducing leakage current of the TFT, leading to more precise display.

Embodiment 2

Figure 4:
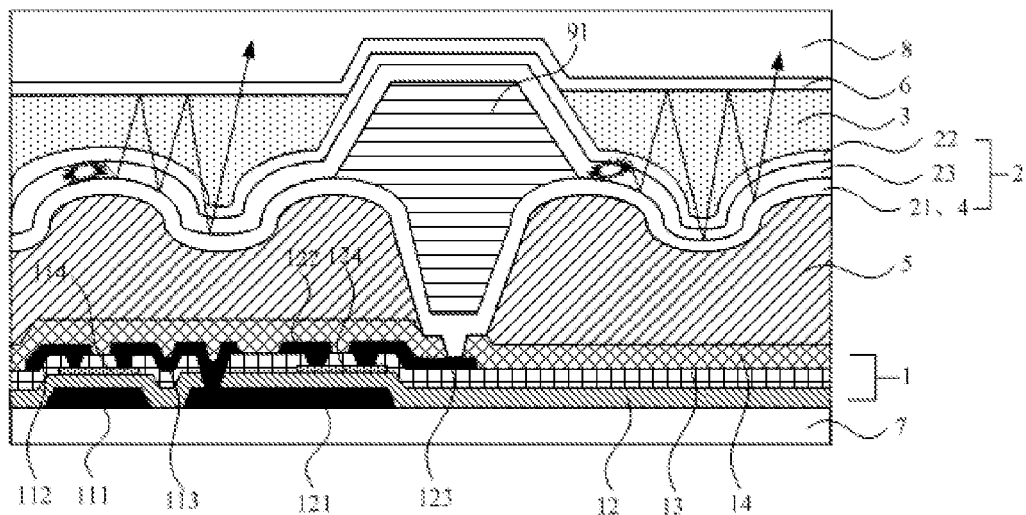
FIG. 4 is a schematic diagram illustrating a cross-sectional structure of a part of an array substrate of Embodiment 2 of the present invention.
Figure 5:
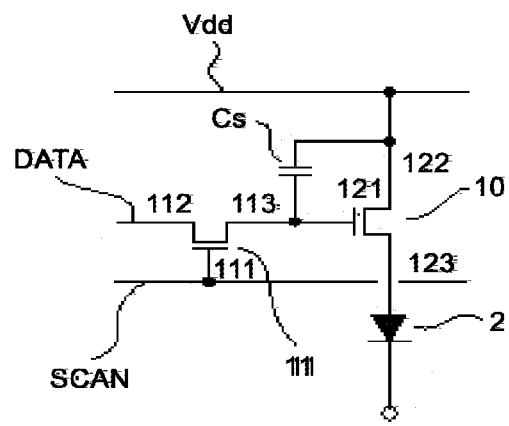
FIG. 5 is an equivalent circuit diagram of an OLED drive circuit of the array substrate of Embodiment 2 of the present invention.

As illustrated in FIGS. 4 and 5, the present embodiment provides an array substrate, which comprises a plurality of pixel units on a substrate 7, wherein a plurality of adjacent pixel units having color filter films of different colors form one 'visible pixel' on a display. Herein a color filter film may have various color modes. Preferably, the color filter film comprises a red filter film, a green filter film, a blue filter film (the RGB mode). Alternatively, the color filter film comprises a red filter film, a green filter film, a blue filter film and a white filter film (the RGBW mode). Alternatively, the color filter film comprises a red filter film, a green filter film, a blue filter film and a yellow filter substrate (the RGBY mode).

As illustrated in FIG. 4, the array substrate sequentially comprises a TFT drive layer 1, a resin layer 5. an OLED 2, a color filter film 3, and an encapsulation layer 8 in a direction further away from the substrate 7.

The TFT drive layer 1 is a TFT array used for driving the OLED 2 to emit light, and mainly comprises a TFT, a scan line SCAN, a data line DATA, a supply voltage line Vdd, a gate insulating layer 12, a spacer insulating layer 13, a passivation layer 14 and other structures.

Herein, each TFT is preferably a metal oxide TFT, such as a Zinc tin oxide (ZnSnO) TFT, an Indium gallium zinc oxide (IGZO) TFT or the like, as a metal oxide TFT has advantages of simple structure, easy fabrication, high migration ratio, excellent uniformity and so on. Of course, an amorphous silicon TFT, an organic TFT etc. can also be feasible.

Preferably, a structure of the TFT drive layer 1 is illustrated in FIG. 4, and the TFT drive layer 1 comprises a plurality sets of TFTs, each set of TFTs are adapted for controlling one pixel unit. Moreover, each set of TFTs comprise a switch TFT 11 and a drive TFT, both of which respectively have active regions 114 and 124 independent from each other. As for the switch TFT 11, the gate electrode 111 is connected to the scan line SCAN, the source electrode 112 is connected to the data line DATA, the drain electrode 113 is connected to the gate electrode 121 of the drive TFT 10, and as for the drive TFT 10, the source electrode 122 is connected to the supply voltage line Vdd and forms a storage capacitor Cs with the drain electrode 113 of the switch TFT 11, the drain electrode 123 is connected to a first electrode 21 (i.e., anode) of the OLED 2, thereby forming an equivalent circuit as shown in FIG. 5. Herein respective structures of the TFT drive layer 1 are separated from each other by the gate insulating layer 12 and the spacer insulating layer 13, and the TFTs are separated from other structures in the array substrate by the passivation layer 14.

Of course, what is described above is just a specific structure of the TFT drive layer 1. which may have other structures, as long as it may drive the OLEDs 2 in respective pixel units independently. As the TFT drive layer 1 may employ various known forms, it will not be elaborated here.

Preferably, a resin layer 5 is disposed above the passivation layer 14 of the TFT drive layer 1, an upper surface of the resin layer 5 has the concave-convex or corrugated structure disposed thereon, and the resin layer 5 preferably has a thickness in the range of 1000 to 30000 Å.

The OLED 2 is disposed on the resin layer 5, and the OLED 2 sequentially comprises the first electrode 21 (i.e. anode), a light emitting layer 23, and a transparent second electrode 22 (i.e. cathode) in a direction away from the substrate 7. Wherein the first electrode 21 is a reflection layer; or as another implementation of the array substrate of the present embodiment, the first electrode 21 may also be transparent (for example, is made of ITO) and has a reflection layer 4 disposed thereunder (the side close to the substrate 7).

Preferably, the reflection layer 4 (the first electrode 21 or a separate reflection layer 4) is made of any metal from silver, aluminum, molybdenum, copper, titanium and chrome or an alloy of two or more metals therefrom, and has a reflectivity of 80% to 100% and a thickness of 100 to 10000 Å.

As the reflection layer 4 is made of material having no fluidity, a concave-convex or corrugated structure corresponding to the concave-convex or corrugated structure on the resin layer 5 is naturally formed on the reflection layer 4, and this concave-convex or corrugated structure may cause diffuse reflection of light incident thereon.

Herein, the concave-convex or corrugated structure can be easily formed on the resin layer 5, and therefore, the concave-convex or corrugated structure on the reflection layer 4 may be easily formed through disposing the resin layer 5 (meanwhile, other layers in the OLED 2 may be formed to have the concave-convex or corrugated structures). Of course, the concave-convex or corrugated structure on the reflection layer 4 can also be realized in other ways. For example, the concave-convex or corrugated structure may be formed on the passivation layer 14 of the TFT drive layer 1 without disposing the resin layer 5, thereby forming the corresponding concave-convex or corrugated structure on the reflection layer 4. Alternatively, the concave-convex or corrugated structure may be formed on the reflection layer 4 directly. Meanwhile, the resin layer 5 may also decrease parasitic capacitance between the first electrode 21 (anode) and various electrodes and wires in the TFT drive layer 1 under the first electrode 21, thus further increasing luminous efficiency.

Preferably, a via is disposed in the resin layer 5, and the first electrode 21 may be electrically connected to the drain electrode of the drive TFT in the TFT drive layer 1 through the via (of course, a corresponding opening should also be disposed in the reflection layer 4 of the TFT drive layer 1). Meanwhile, an insulating pixel defining layer (PDL) 91 between the first electrode 21 and the light emitting layer 23 is disposed at the via.

In this embodiment, the resin layer 5 is disposed between the OLED 2 and the TFT drive layer 1, and therefore the first electrode 21 needs to be electrically connected to the TFT drive layer 1 through the via. However, the reflection layer 4 has no concave-convex or corrugated structure at the via, and orientation of the light emitting layer 23, the thickness of the microcavity structure etc, are all not uniform, so the light emitting layer 23 at this position is not supposed to emit light (or no OLED 2 is formed at this position), thus it is required to dispose the insulating PDL 91 to block current between the first electrode 21 and the light emitting layer 23 at this position. Of course, the PDL 91 may be in other forms, such as being disposed between the second electrode 22 and the light emitting layer 23, as long as the PDL 91 may function as preventing the OLED 2 from emitting light (in other words, as long as it may function as defining the display region of the pixel unit).

Of course, the first electrode 21 may also be electrically connected to the TFT drive layer 1 by other ways, such as by locations between respective pixel units.

Preferably, the transparent second electrode 22 is made of any one of indium tin oxide (ITO), indium zinc oxide (IZO), poly (3,4-ethylenedioxy-thiophene)-poly (styrene sulfonic acid) (PEDOT-PSS), and carbon nanotube (CNT).

Preferably, the light emitting layer 23 is a light emitting layer used for emitting white light and can achieve function of emitting white light by various ways. Further preferably, wherein the light emitting layer used for emitting white light comprises: overlapping organic electroluminescent material layers for emitting red light, green light and blue light, respectively; or an organic electroluminescent material layer formed by mixing organic electroluminescent materials emitting red light, green light and blue light, respectively.

As WOLED technology is relatively mature, and white light, after passing a color filter film, may directly become light of the same color as the color filter film, display is easily realized with the light emitting layer 23 emitting white light. Of course, it is also feasible that the light emitting layer 23 may emit light with a color, as long as colors of the color filter films are changed accordingly to ensure that display can be eventually realized.

Obviously, although the first electrode 21 in this embodiment is the anode of the OLED 2 and the second electrode 22 is the cathode of the OLED 2, it is also feasible that the first electrode 21 is the cathode of the OLED 2 and the second electrode 22 is the anode of the OLED 2.

The color filter film 3 is disposed on the OLED 2 to filter light passing therethrough. The color filter films in respective pixel units are of different colors, thereby causing the respective pixel units to emit light of different colors. As the color filter film 3 has a relatively large thickness and has fluidity before being cured, its upper surface is generally planar. Of course, it is also feasible to form the concave-convex or corrugated structure on the color filter film 3.

Preferably, a thickness of the color filter film is in the range of 5000~40000 Å. Since the color filter film 3 is disposed in the microcavity structure, a range of the thickness of the color filter film 3 is relatively large. Thus, thickness of the microcavity structure may be controlled by adjusting thickness of the color filter film 3, such that the microcavity structure in each pixel unit may intensify light having the same color as the color filter film.

The transflective layer 6 is disposed on the color filter film 3, the transflective layer 6 and the reflection layer 4 (the first electrode 22 or a separate reflection layer 4) form the microcavity structure. Light emitted from the light emitting layer 23 may be reflected between the two layers for multiple times before emitted outside from the transflective layer 6. Moreover, Due to the resonance effect, light with a specific wavelength (light having the same color as the color filter film of the pixel unit) is intensified, thereby improving the luminous efficiency; With the concave-convex or corrugated structure on the reflection layer 4, diffuse reflection of light occurs when light is incident on the reflection layer 4, further increasing luminous efficiency, and research shows that luminous efficiency may be improved by 50% in comparison with the array substrate without the concave-convex or corrugated structure Preferably, a via is disposed in the color filter film 3, the second electrode 22 is electrically connected to the transflective layer 6 made of conductive material through the via, and the PDL 91 between the first electrode 21 and the light emitting layer 23 is disposed at the via.

That is to say, the second electrode 22 is preferably electrically connected to the transflective layer 6 through the via in the color filter film 3 so that the transflective layer 6 facilitates the second electrode 22 in conducting electricity, so as to decrease its resistance and prevent TFT drive from being not uniform, therefore luminous efficiency and display effect can be increased. Since there is no color filter film 3 at the via, this position cannot be used to emit light so it is required to dispose the PDL 91.

Obviously, as a preferable solution, vies in the resin layer 5 and the color filter film 3 are disposed at the same position, so that it is only required to dispose one PDL 91 to simplify the final structure.

Of course, the second electrode 22 may also be electrically connected to the transflective layer 6 by other ways, such as through locations between respective pixel units.

Preferably, the transflective layer 6 is made of any metal from silver, aluminum, molybdenum, copper, titanium and chrome or an alloy of two or more metals therefrom, and has a transmissivity of 5% to 95% and a thickness of 10 to 200 Å.

Of course, the array substrate of the present invention may also have other conventional structures, for example, the PDL 91 may also be disposed at edges of respective pixel units.

Embodiment 3

The present embodiment provides a method for fabricating an array substrate, which comprises the following steps:

forming a pattern comprising a TFT drive layer on a substrate;

forming a pattern comprising an OLED on the subject subjected to the previous step, wherein a second electrode of the OLED away from the substrate is transparent, and a first electrode of the OLED close to the substrate is a reflection layer, or a first electrode of the OLED close to the substrate is transparent and a reflection layer is disposed thereunder;

forming a pattern comprising a color filter film on the substrate subjected to the previous step; and forming a pattern comprising a transflective layer on the substrate subjected to the previous step.

In an array substrate fabricated according to the method of the present invention, the color filter film is disposed in the microcavity structure, and therefore thickness of the microcavity structure may be adjusted by respectively controlling thickness of respective color filter films of different colors when forming the color filter films, without adding any new step. Therefore, the fabrication process is simple and of low cost.

Embodiment 4

Figure 6:
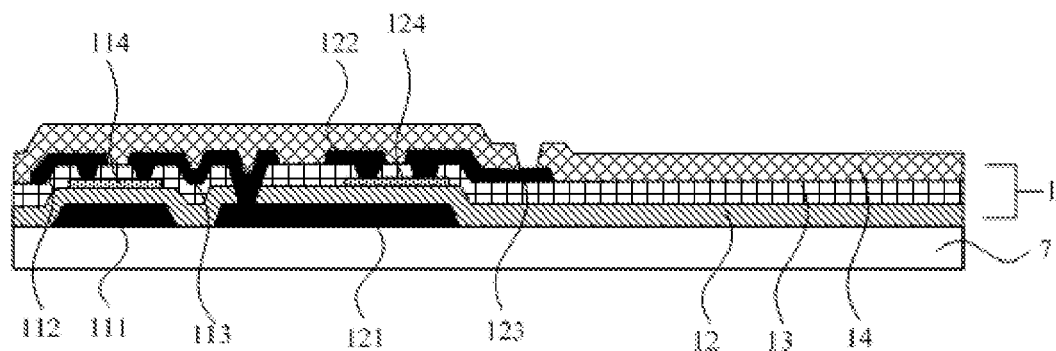
FIG. 6 is a schematic diagram illustrating a cross-sectional structure of a part of an array substrate after forming a TFT drive layer in a method for fabricating an array substrate of Embodiment 4 of the present invention.

The present embodiment provides a method for fabricating the above array substrate, as illustrated in FIGS. 6 to 10, the method comprises the following steps:

S01. forming a pattern of a TFT drive layer 1 on a substrate 7, obtaining a structure as illustrated in FIG. 6. Herein the TFT drive layer 1 comprises a structure with a plurality of layers, which may be sequentially formed in multiple patterning processes. Generally, a patterning process comprises: first forming a whole film layer with a specific material (e.g., by means of deposition, coating, sputtering etc.), and then removing a part of the whole film layer through a photolithography process (generally comprising photoresist application, exposing, developing, etching, photoresist removal and other steps), such that the remaining part forms the desired pattern. A patterning process is a known process and the structure of the TFT drive layer 1 may be the same as that in the prior art, and therefore detail formation procedure thereof will not be described in details here.

Figure 7:
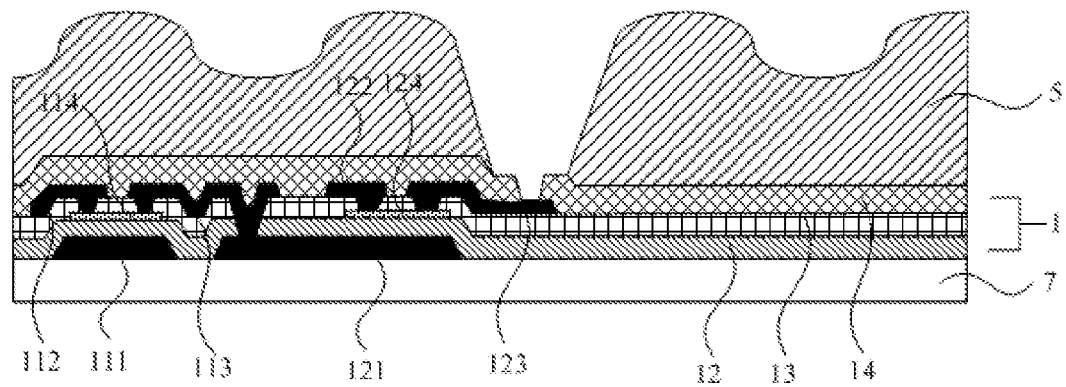
FIG. 7 is a schematic diagram illustrating a cross-sectional structure of a part of an array substrate after forming a resin layer in the method for fabricating an array substrate of Embodiment 4 of the present invention.

S02. forming a resin layer 5, forming a concave-convex or corrugated structure on the resin layer 5 by printing or by a patterning process using a dual-tone mask, and forming a via connected to the TFT drive layer 1 in the resin layer 5 through a patterning process (it may be a separate patterning process or the patterning process for forming the concave-convex or corrugated structure), so as to obtain a structure as illustrated in FIG. 7. Herein a patterning process using a dual-tone mask generally refers to as a process in which a dual-tone mask (comprising a half-tone mask and a gray-tone mask) is used to control exposure amount of photoresist at different locations, such that a part of photoresist is exposed partially, and therefore, the underlying layer is partially etched in the following etching step, thereby generating the concave-convex or corrugated structure. Of course, the resin layer 5 may also be formed of photosensitive resin material, and be this means, the structure illustrated in FIG. 7 may be obtained by directly performing exposing and developing in the patterning process, without performing any process related to photoresist.

Figure 8:
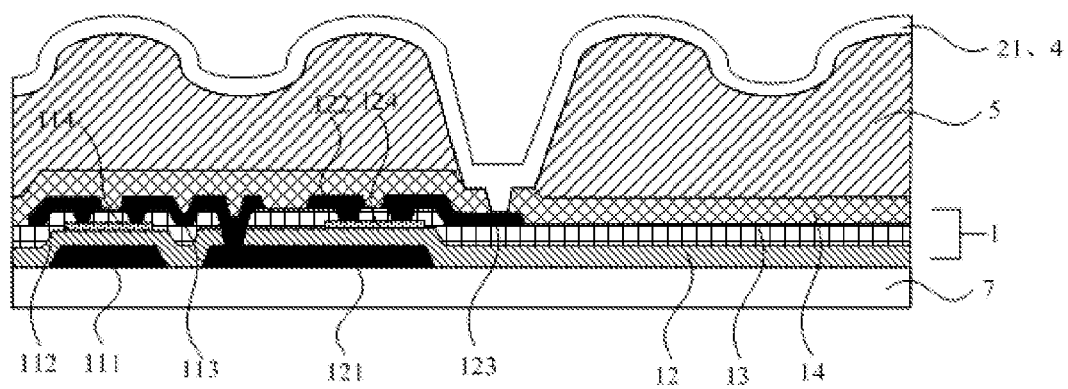
FIG. 8 is a schematic diagram illustrating a cross-sectional structure of a part of an array substrate after forming a first electrode (a reflection layer) in the method for fabricating an array substrate of Embodiment 4 of the present invention.
Figure 9:
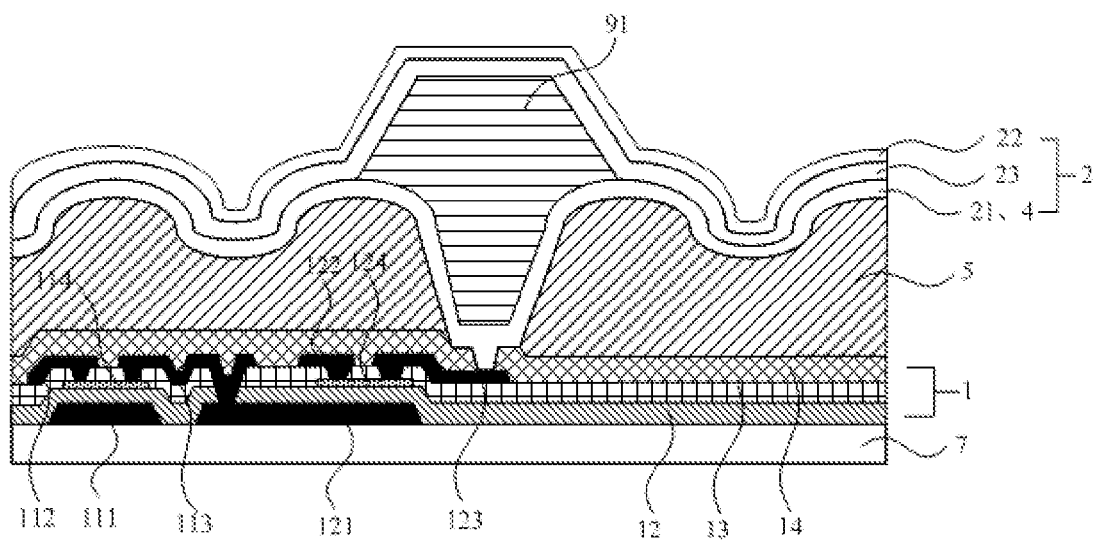
FIG. 9 is a schematic diagram illustrating a cross-sectional structure of a part of an array substrate after an OLED film in the method for fabricating an array substrate of Embodiment 4 of the present invention.

S03. forming a pattern comprising an OLED 2, which comprises:

S031. forming a pattern of the first electrode 21 for reflecting light (i.e. the reflection layer 4) (as illustrated in FIG. 8) through a patterning process, or first forming a pattern of the reflection layer 4 through a patterning process and then forming a pattern of the transparent first electrode 21 through a patterning process; wherein the concave-convex or corrugated structure exists on the resin layer 5, the concave-convex or corrugated structure corresponding to the concave-convex or corrugated structure on the resin layer 5 is naturally formed on the reflection layer 4. The concave-convex or corrugated structure on the reflection layer 4 may cause diffuse reflection of light incident thereon, and meanwhile, no matter which configuration is used, the first electrode 21 is electrically connected to the TFT drive layer 1 through the via in the resin layer;

S032. forming a pattern of an insulating pixel defining layer 91, which is at least formed above the via, through a patterning process, S033. forming a light emitting layer 23; and S034. forming the transparent second electrode 22 to obtain the structure illustrated in FIG. 9.

Figure 10:
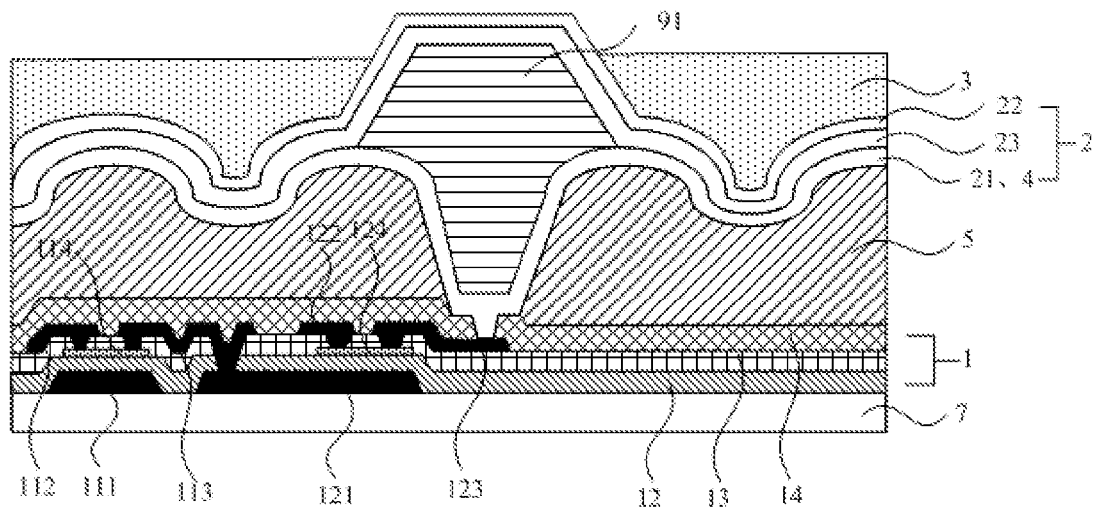
FIG. 10 is a schematic diagram illustrating a cross-sectional structure of a part of an array substrate after forming a color filter film in the method for fabricating an array substrate of Embodiment 4 of the present invention r.

S04. respectively forming color filter films of the required colors in respective pixel units through printing or through a patterning process, to obtain a pattern of the color filter film 3 so as to obtain the structure illustrated in FIG. 10. Herein preferably the color filter film 3 has a via so that the transflective layer 6 formed after the color filter film 3 may be connected to the second electrode 22; and the via may be directly formed by forming the color filter film 3 only at the periphery of the PDL 91 or may be formed through a patterning process. Preferably, a curing temperature of the color filter film 3 is less than or equal to 130° C., since at this time the light emitting layer 23 has been formed, a too high temperature may destroy the light emitting layer 23, so it is required to control the curing temperature of the color filter film 3.

S05. forming the transflective layer 6; and

S06. forming an encapsulation layer 8, so as to obtain the array substrate illustrated in FIG. 4. At this point, the array substrate may function as an OLED display device, or packaging and other processes may be performed on the array substrate to obtain an OLED display device.

Embodiment 5

The present embodiment provides an OLED display device comprising the above array substrate. The display device may include an OLED panel, a mobile phone, a tablet PC, a television, a display, a notebook PC, a digital photo-frame, a navigator and any other product or device having a display function.

The OLED display device of this embodiment has the above array substrate, and therefore is of simple fabrication process, and low cost.

Of course, the OLED display device of this embodiment may have other conventional structures such as an enclosed substrate which is assembled with the array substrate to form a cell, a power unit, a display drive unit and the like.

It should be understood that, the above implementations are only exemplary embodiments used to explain the principle of the present invention. However, the present invention is not limited thereto. For a person skilled in the art, various variations and improvements can be made without departing from the spirit and substance of the present invention, and these variations and improvements are also deemed as the protection scope of the present invention.

What is claimed is:

1. An array substrate, comprising a plurality of pixel units disposed on a substrate, wherein each pixel unit comprises:
    a TFT drive layer;
    an OLED further away from the substrate than the TFT drive layer and driven by the TFT drive layer, the OLED sequentially comprising a first electrode, a light emitting layer, and a transparent second electrode in a direction away from the substrate, wherein the first electrode is a reflection layer, or the first electrode is transparent and has a reflection layer disposed thereunder;
    a transflective layer further away from the substrate than the OLED and forming a microcavity structure together with the reflection layer; and a color filter film disposed between the OLED and the transflective layer and located in the microcavity structure,
        wherein color filter films of pixel units of different colors have different thicknesses so that microcavity structures of the pixel units of different colors have different thicknesses.

2. The array substrate of claim 1, wherein the light emitting layer is a light emitting layer used for emitting white light.

3. The array substrate of claim 2, wherein the light emitting layer used for emitting white light comprises:
   overlapping organic electroluminescent material layers for emitting red light, green light and blue light, respectively;
   or
   an organic electroluminescent material layer formed by mixing organic electroluminescent materials emitting red light, green light and blue light, respectively.

4. The array substrate of claim 1, wherein a reflective surface of the reflection layer has a concave-convex or corrugated structure disposed thereon for causing diffuse reflection of light.

5. The array substrate of claim 2, wherein a reflective surface of the reflection layer has a concave-convex or corrugated structure disposed thereon for causing diffuse reflection of light.

6. The array substrate of claim 3, wherein a reflective surface of the reflection layer has a concave-convex or corrugated structure disposed thereon for causing diffuse reflection of light.

7. The array substrate of claim 4, further comprising a resin layer disposed between the reflection layer and the TFT drive layer, and a surface of the resin layer contacting the reflection layer has a concave-convex or corrugated structure disposed thereon.

8. The array substrate of claim 5, further comprising a resin layer disposed between the reflection layer and the TFT drive layer, and a surface of the resin layer contacting the reflection layer has a concave-convex or corrugated structure disposed thereon.

9. The array substrate of claim 6, further comprising a resin layer disposed between the reflection layer and the TFT drive layer, and a surface of the resin layer contacting the reflection layer has a concave-convex or corrugated structure disposed thereon.

10. The array substrate of claim 7, wherein a via is disposed in the resin layer, the first electrode is electrically connected to the TFT drive layer through the via, and an insulating pixel defining layer between the first electrode and the light emitting layer is disposed at the via;
    and/or a thickness of the resin layer is in the range of 1000 to 30000 Å.

11. The array substrate of claim 8, wherein a via is disposed in the resin layer, the first electrode is electrically connected to the TFT drive layer through the via, and an insulating pixel defining layer between the first electrode and the light emitting layer is disposed at the via; and/or
    a thickness of the resin layer is in the range of 1000 to 30000 Å.

12. The array substrate of claim 1, wherein
    the TFT drive layer comprises a scan line, a data line, a supply voltage line and a plurality sets of TFTs, each set of TFTs are used to drive the OLED in one pixel unit, wherein each set of TFTs comprise a switch TFT and a drive TFT, as for the switch TFT, a gate electrode thereof is connected to the scan line, a source electrode thereof is connected to the data line, and a drain electrode thereof is connected to a gate electrode of the drive TFT, and as for the drive TFT, a source electrode thereof is connected to the supply voltage line, and a drain electrode thereof is connected to the first electrode of the OLED; and/or
    the reflection layer is made of any metal from silver, aluminum, molybdenum, copper, titanium and chrome or an alloy of any two or more metals therefrom, and has a reflectivity of 80% to 100% and a thickness of 100 to 10000 Å; and/or
    the transflective layer is made of any metal from silver, aluminum, molybdenum, copper, titanium and chrome or an alloy of any two or more metals therefrom, and has a transmissivity of 5% to 95% and a thickness of 10 to 200 Å; and/or
    a via is disposed in the color filter film, the second electrode is electrically connected to the transflective layer through the via, the transflective layer is made of conductive material, and an insulating pixel defining layer between the first electrode and the light emitting layer is disposed at the via; and/or
    a thickness of the color filter film is in the range of 5000~40000 Å; and/or
    the transparent second electrode is made of any one of indium tin oxide, indium zinc oxide, poly(3,4-ethylene-dioxy-thiophene)-poly(styrene sulfonic acid), and carbon nanotube.

13. The array substrate of claim 1, wherein the color filter film comprises:
    a red filter film, a green filter film and a blue filter film; or
    a red filter film, a green filter film, a blue filter film and a white filter film; or
    a red filter film, a green filter film, a blue filter film and a yellow filter film.

14. The array substrate of claim 1, wherein the first electrode is a cathode of the OLED, and the second electrode is an anode of the OLED; or
    the first electrode is an anode of the OLED, and the second electrode is a cathode of the OLED.

15. An OLED display device, comprising an array substrate comprising a plurality of pixel units disposed on a substrate, wherein each pixel unit comprises:
    a TFT drive layer;
    an OLED further away from the substrate than the TFT drive layer and driven by the TFT drive layer, the OLED sequentially comprising a first electrode, a light emitting layer, and a transparent second electrode in a direction away from the substrate, wherein the first electrode is a reflection layer, or the first electrode is transparent and has a reflection layer disposed thereunder;
    a transflective layer further away from the substrate than the OLED and forming a microcavity structure together with the reflection layer; and
    a color filter film disposed between the OLED and the transflective layer and located in the microcavity structure,
        wherein color filter films of pixel units of different colors have different thicknesses so that microcavity structures of the pixel units of different colors have different thicknesses.

* * * * *